ASTABLE MULTIVIBRATOR WITH SATURABLE CORE TIMING CIRCUIT
Filed Sept. 18, 1961
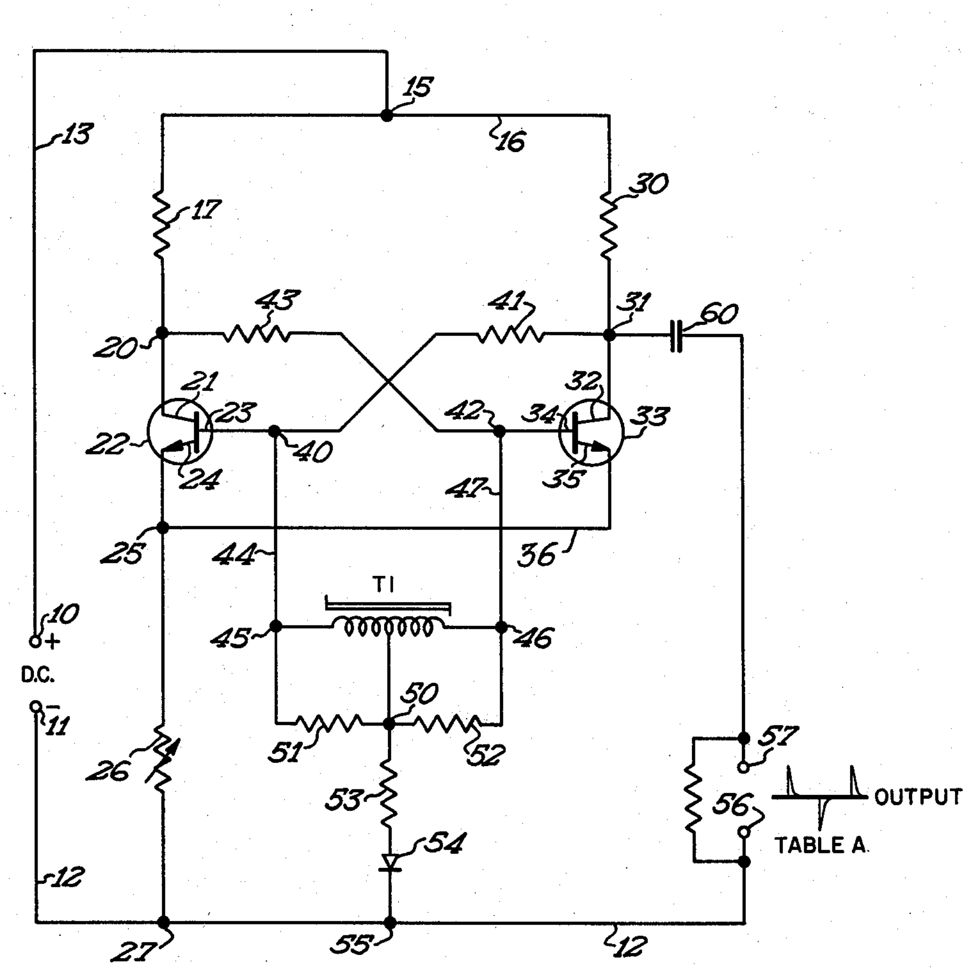
INVENTOR.
JOHN C. FREEBORN
BY
Omund R. Dahle
ATTORNEY

United States Patent Office 3,172,058

Patented Mar. 2, 1965

3,172,058

ASTABLE MULTIVIBRATOR WITH SATURABLE CORE TIMING CIRCUIT

John C. Freeborn, Azusa, Calif., assignor to Honeywell Inc., a corporation of Delaware Filed Sept. 18, 1961, Ser. No. 138,709
1 Claim. (Cl. 331—113)

This invention relates to a solid state precision timer oscillator and more specifically to a low frequency transistor-toroid timer oscillating circuit.

In prior art electronic timers using crystal time bases, the problem has always existed that the crystal may be destroyed by severe shock and prior art electronic timers using capacitive timing elements encounter drift when exposed to high temperatures and long shelf life. In the present invention a precision oscillator is obtained because of the use of a timing toroid which is unaffected by age, humidity or severe vibration and shock effects, and which does not store energy in its timing components whereby it will fail safe in the event of a power failure. This in contrast to capacitive timers that store energy in their timing elements and that often cause function prematurely in the event of a power failure. The solid state timer of this invention has no moving parts and being potted has withstood 4,000 G's. of shock without appreciable change in accuracy.

It is therefore an object of this invention to provide a precision solid state magnetic timing device oscillator adaptable for use at low frequencies.

This and other objects of the invention will become more apparent on a consideration of the specification, claim and drawing of which the single figure is a schematic diagram of a preferred embodiment of the invention.

Referring now to the drawing, a regulated direct current input is connected to a pair of terminals 10 and 11 with a terminal 10 being positive with respect to terminal 11. Terminal 11 is connected to a common negative conductor 12 and terminal 10 is connected by a conductor 13 to a junction 15 on the conductor 16. The conductor 16 is connected through a load resistor 17 and a junction 20 to a collector electrode 21 of a npn transistor 22. Transistor 22 also includes a base electrode 23 and an emitter electrode 24. The emitter electrode 24 is connected by a junction 25 and an emitter resistor 26 to a junction 27 on the negative conductor 12.

Conductor 16 is also connected through a load resistor 30 and a junction 31 to a collector electrode 32 of a npn transistor 33, which transistor also includes a base electrode 34 and an emitter electrode 35. The emitter electrode 35 is connected by a conductor 36 to the junction 25.

Base electrode 23 of transistor 22 is connected by a junction 40 and a cross coupling resistor 41 to the junction 31 and thereby to collector electrode 32. Similarly, base electrode 34 of transistor 33 is connected by a junction 42 and a cross coupling resistor 43 to the junction 20 and thereby to collector electrode 21.

A saturable core inductance or timing toroid, which has a substantially rectangular hysteresis loop, interconnects the base electrodes of the two transistors. The circuit may be traced from the junction 40 at base 23 through a conductor 44, a junction 45, through the timing toroid T1 to a junction 46 and through a conductor 47 to the junction 42 at base 34. A mid tap connection on the timing toroid T1 connects to a junction 50. Connected between the junctions 45 and 50 is a resistor 51 and similarly connected between the junction 46 and junction 50 is a resistor 52. Junction 50 is connected through a low impedance resistor 53 and a rectifying diode 54 to a junction 55 on the conductor 12. A pair of output terminals 56 and 57 are connected respectively to the conductor 12 and 57 is connected through a coupling capacitor 60 to the junction 31.

In considering the operation of the circuit generally, the time it takes the toroid T1 to saturate serves as the time base. One cycle of operation of the circuit is explained below. Assuming initially that transistor 33 is conductive or "on" and transistor 22 is "off," one-half of the circuit conducts current from terminal 10 through conductors 13 and 16, resistor 30, transistor 33 from collector 32 to emitter 35, and through common emitter resistor 26 to the negative conductor 12.

During this time current also flows through resistors 17 and 43, junction 42, conductor 47, from junction 46 through the toroid to the mid tap of toroid T1 and through resistor 53 and diode 54 to conductor 12. Little or substantially no current flows through the remaining portions of the toroid winding. The induced opposite phase voltage in the remaining portion of the winding opposes current flow therethrough and also aids in maintaining transistor 22 "off." The conduction through the right hand portion of toroid T1 is small and slowly drives the toroid towards saturation. It will be noted that the right hand portion of the toroid and resistors 53 together with diode 54 are in parallel with the base-emitter circuit of "on" transistor 33 and provide base current potential therefor.

When the toroid core reaches flux saturation, the impedance of the toroid is reduced, reducing the base bias voltage of transistor 33. The reduced bias of transistor 33 tends to cut off the conduction thereof and the resultant voltage increase at collector 32 and junction 31 provides a positive potential through resistor 41 to base 23 to render transistor 22 conductive. The cross coupling causes a switching action to occur very rapidly, thereby initiating the second half cycle of oscillation by turning transistor 22 on and 23 off.

A current path may now be traced from terminal 10 through conductors 13 and 16, resistor 17, transistor 22 from collector 21 to emitter 24 and to the common emitter resistor 26 to the negative conductor 12. A further current path may be traced through the resistors 30 and 41, junctions 40 and 45, the left hand portion of the toroid and from the mid point thereof through resistor 53 and diode 54 to conductor 12. Current now flows in the toroid in a reverse direction causing the flux to gradually change towards saturation in the opposite direction. When saturation is finally reached, another reversal is caused. The resistors 51 and 52 are high impedance shunts across the two halves of the toroid winding T1 and each forms a voltage divider with resistor 53 to ground. The diode 54 is connected in the circuit to provide a degree of temperature-voltage compensation for the base emitter junction of the "on" transistor. Frequency modification and temperature compensation can be obtained in the choice of proper component values for resistors 26 and 53.

This highly accurate circuit is adaptable to operate at very low frequencies in the order of five seconds per cycle and it may be adjusted to oscillate at a more rapid rate or more slowly by the means above described and the choice of a proper toroid.

In general, I have shown a specific embodiment of my invention, it is to be understood that this is for the purpose of illustration and that my invention is to be limited solely by the scope of the appended claim.

I claim:

Low frequency oscillator comprising: a first and a second input terminal for connection to a source of direct current electric potential; a first and a second semiconductor current control means each having an input electrode, an output electrode, and a control electrode for varying the conductivity of a current flow path between the input and the output electrodes of respective current control means; direct current cross-coupling means, including impedance means, connecting the control electrode of each current control means to the input electrode of the other current control means; a first and a second impedance means respectively connecting the input electrodes of said first and said second current control means to said first input terminal; means connecting the output electrodes of said control means to said second input terminal; a saturable core timing means including a winding having a pair of end terminals and an intermediate tap, said end terminals being respectively connected to the control electrode of said first and second current control means and hence respectively connected through said impedance means of said direct current cross-coupling means to said input electrodes of said second and first current control means whereby the current flow through said saturable core timing means is substantially independent of the current flow through said semiconductor control means; and means connecting said intermediate tap of said saturable core means to said second input terminal.

References Cited by the Examiner

UNITED STATES PATENTS

| | | | |
|---|---|---|---|
| 2,911,595 | 11/59 | Venema | 331—144 |
| 2,954,532 | 9/60 | Pentecost et al. | 331—144 |
| 2,963,658 | 12/60 | Rochelle | 331—113 |
| 2,968,738 | 1/61 | Pintell | 331—113 |

JOHN KOMINSKI, *Acting Primary Examiner.*

ROY LAKE, *Examiner.*